(12) United States Patent
Kim et al.

(10) Patent No.: US 8,350,840 B2
(45) Date of Patent: Jan. 8, 2013

(54) SWITCHING CIRCUIT, DC-DC CONVERTER AND DISPLAY DRIVER INTEGRATED CIRCUIT INCLUDING THE SAME

(75) Inventors: Hyo Jin Kim, Suwon-si (KR); Jae Sung Kang, Suwon-si (KR); Si Woo Kim, Hwasung-si (KR); Jong-Hyun Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 555 days.

(21) Appl. No.: 12/587,512

(22) Filed: Oct. 8, 2009

(65) Prior Publication Data

US 2010/0091002 A1   Apr. 15, 2010

(30) Foreign Application Priority Data

Oct. 13, 2008   (KR) .................. 10-2008-0100191

(51) Int. Cl.
*H03K 17/687* (2006.01)
*G06F 3/038* (2006.01)

(52) U.S. Cl. ............ 345/211; 345/82; 345/98; 345/100; 345/204; 345/213; 323/222; 327/434

(58) Field of Classification Search .............. 345/76–77, 345/82, 89, 100, 204, 211–213, 98; 327/434; 315/169.1–169.3; 323/222–225, 265, 268, 323/271, 282, 351; 341/118, 138, 144, 148, 341/154
See application file for complete search history.

(56) References Cited

U.S. PATENT DOCUMENTS

| | | | |
|---|---|---|---|
| 2005/0128112 A1* | 6/2005 | Miyata et al. ................. | 341/138 |
| 2006/0261991 A1* | 11/2006 | Lin et al. ....................... | 341/144 |
| 2007/0057898 A1 | 3/2007 | Nakajima et al. | |
| 2007/0273633 A1* | 11/2007 | Hashimoto et al. ............ | 345/98 |

FOREIGN PATENT DOCUMENTS

| | | |
|---|---|---|
| JP | 2004-350343 A | 12/2004 |
| JP | 2006-204366 A | 8/2006 |
| JP | 2006-320038 A | 11/2006 |
| KR | 10-2006-0012300 A | 2/2006 |

* cited by examiner

*Primary Examiner* — Lun-Yi Lao
*Assistant Examiner* — Md Saiful A Siddiqui
(74) *Attorney, Agent, or Firm* — Onello & Mello LLP (57) ABSTRACT

A switching circuit and a DC-DC converter including the same are provided. The switching circuit includes an output terminal, a plurality of input terminals, and a plurality of switches configured to selectively connect the plurality of input terminals to the output terminal. The plurality of switches include a first switch directly connected to the output terminal and a plurality of second switches connecting the plurality of input terminals to the first switch. The first switch is implemented using a high-voltage transistor. Each of the second switches is implemented using a low-voltage transistor. A gate of the high-voltage transistor is at least two times longer than a gate of the low-voltage transistor. The DC-DC converter increases or decreases a signal selected from among a plurality of input signals input through the input terminals by a predetermined voltage level. Most of switches in the switching circuit are implemented using low-voltage transistors, thereby decreasing the area of the switching circuit.

9 Claims, 8 Drawing Sheets

SWITCHING CIRCUIT, DC-DC CONVERTER AND DISPLAY DRIVER INTEGRATED CIRCUIT INCLUDING THE SAME

CROSS-REFERENCE TO RELATED APPLICATIONS

This application claims priority under 35 U.S.C. §119(e) to Korean Patent Application No. 10-2008-0100191 filed on Oct. 13, 2008, in the Korean Intellectual Property Office, the entire contents of which are incorporated herein by reference.

BACKGROUND

The present invention relates to switching circuit, and more particularly, to a switching circuit implemented by a medium- or low-voltage transistor instead of a high-voltage transistor and a direct-current-to-direct-current (DC-DC) converter including the switching circuit.

Display devices or portable electronic devices usually use a DC-DC converter, which increases or decreases a constant DC voltage provided from the outside, in order to provide operating power necessary to operate internal elements.

The DC-DC converter usually includes a charge pump including a capacitor and a switch. The switch is implemented using a transistor. It may be implemented using a high-voltage transistor or a low-voltage transistor depending on the level of voltage to be switched. Since the high-voltage transistor requires a high withstanding voltage as compared to the low-voltage transistor, it has a thicker gate insulating layer and a longer channel than the low-voltage transistor. That is, the high-voltage transistor is much larger than the low-voltage transistor, and therefore, the more high-voltage transistors are used, the more area is needed.

SUMMARY

Some embodiments of the present invention provide a switching circuit for reducing an occupied area by using a low-voltage transistor instead of a high-voltage transistor and a DC-DC converter including the same.

According to one aspect, the present inventive concept is directed to a switching circuit including an output terminal, a first switch connected between the output terminal and a first node to operate in response to a first switching control signal, a second switch connected between the first node and a second node to operate in response to a second switching control signal, and a third switch connected between the first node and a third node to operate in response to a third switching control signal. The first switch is implemented using a high-voltage transistor, and each of the second and third switches is implemented using a low-voltage transistor. A gate of the high-voltage transistor is at least two times longer than a gate of the low-voltage transistor.

In one embodiment, the second node and the third node may receive a first input signal and a second input signal, respectively, and the switching circuit selectively transmits the first and second input signals to the output terminal in response to the first through third switching control signals.

In one embodiment, the switching circuit may further include a fourth switch connected between the second node and a fourth node to operate in response to a fourth switching control signal; a fifth switch connected between the second node and a fifth node to operate in response to a fifth switching control signal; a sixth switch connected between the third node and a sixth node to operate in response to a sixth switching control signal; and a seventh switch connected between the third node and a seventh node to operate in response to a seventh switching control signal. Each of the fourth through seventh switches may be implemented using a low-voltage transistor.

In one embodiment, the fourth through seventh nodes receive first through fourth input signals, respectively, and the switching circuit selectively transmits the first through fourth input signals to the output terminal in response to the first through seventh switching control signals.

According to another aspect, the present inventive concept is directed to a switching circuit including an output terminal, a plurality of input terminals, and a plurality of switches configured to selectively connect the plurality of input terminals to the output terminal. The plurality of switches include a first switch directly connected to the output terminal and a plurality of second switches connecting the plurality of input terminals to the first switch. The first switch is implemented using a high-voltage transistor, and each of the second switches is implemented using a low-voltage transistor. A gate of the high-voltage transistor is at least two times longer than a gate of the low-voltage transistor.

In one embodiment, the first switch may include a first high-voltage transistor connected between the output terminal and a first node to operate in response to a first switching control signal.

In one embodiment, the second switches may include a first low-voltage transistor connected between the first node and a second node to operate in response to a second switching control signal and a second low-voltage transistor connected between the first node and a third node to operate in response to a third switching control signal.

In one embodiment, the second switches further comprise: a third low-voltage transistor connected between the second node and a fourth node to operate in response to a fourth switching control signal; a fourth low-voltage transistor connected between the second node and a fifth node to operate in response to a fifth switching control signal; a fifth low-voltage transistor connected between the third node and a sixth node to operate in response to a sixth switching control signal; and a sixth low-voltage transistor connected between the third node and a seventh node to operate in response to a seventh switching control signal. The fourth through seventh nodes receive first through fourth input signals, respectively.

In one embodiment, voltage levels of the first through fourth input signals decrease in order of the first to the fourth input signals. When the first input signal is selected and transmitted to the output terminal, the second low-voltage transistor is controlled not to be connected with the fourth input signal. When the fourth input signal is selected and transmitted to the output terminal, the first low-voltage transistor is controlled not to be connected with the first input signal.

According to another aspect, the present inventive concept is directed to a DC-DC converter including the above-described switching circuit. The DC-DC converter increases or decreases a signal selected from among a plurality of input signals input through the input terminals by a predetermined voltage level.

According to another aspect, the present inventive concept is directed to a display driver integrated circuit (IC) which includes the above-described DC-DC converter and a display driver configured to drive a plurality of data lines and a plurality of gate lines in a display panel based on at least one DC-DC converted voltage. The DC-DC converter outputs the at least one DC-DC converted voltage based on a plurality of input signals input through the plurality of input terminals.

In one embodiment, the display driver IC is a liquid crystal display (LDC) driver IC or an organic light-emitting diode (OLED) driver IC.

BRIEF DESCRIPTION OF THE DRAWINGS

The foregoing and other features and advantages of the inventive concept will be apparent from the more particular description of preferred aspects of the inventive, as illustrated in the accompanying drawings in which like reference characters refer to the same parts throughout the different views. The drawings are not necessarily to scale, emphasis instead being placed upon illustrating the principles of the inventive concept.

DETAILED DESCRIPTION OF THE EMBODIMENTS

The present invention now will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this description will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
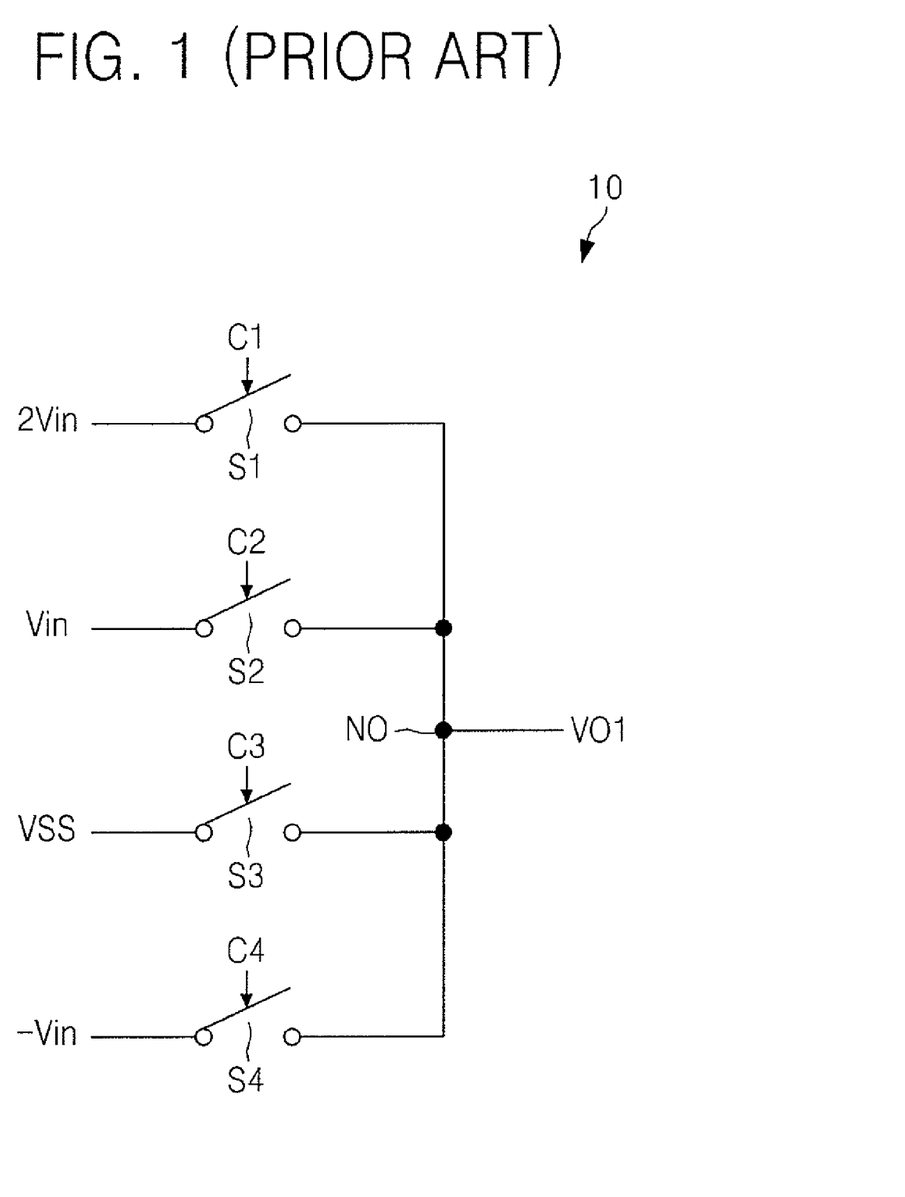
FIG. 1 is a circuit diagram of a switching circuit for comparison with embodiments of the present inventive concept.

FIG. 1 is a circuit diagram of a switching circuit 10 according to a comparative example of the present inventive concept. The switching circuit 10 includes first through fourth input terminals, an output terminal NO, and first through fourth switches S1, S2, S3, and S4.

The switching circuit 10 receives first through fourth input voltages 2Vin, Vin, VSS, and −Vin through the first through fourth input terminals, respectively. The first through fourth switches S1 through S4 selectively output the first through fourth input voltages 2Vin, Vin, VSS, and −Vin, respectively, as an output voltage VO1 in response to switching control signals C1, C2, C3, and C4, respectively. The first through fourth switches S1 through S4 may be implemented by transistors.

When a difference between voltages at both ends of a switch is a high voltage having a predetermined or higher level, the switch should be implemented by a high-voltage transistor. It is assumed that when the voltage difference between both ends of the switch is 2Vin or less, it is referred to as low voltage and when the voltage difference exceeds 2Vin, it is referred to as high voltage.

In the switching circuit 10 illustrated in FIG. 1, the output voltage VO1 may be one of the first through fourth input voltages 2Vin, Vin, VSS, and −Vin. For instance, when only the fourth switch S4 is turned on and the first through third switches Si through S3 are turned off, the output voltage VO1 is the fourth input voltage −Vin. In this example, the voltage difference between both ends of the first switch S1 is 3Vin, and therefore, the first switch S1 needs to be implemented by a high-voltage transistor. Similarly, the fourth switch S4 also needs to be implemented by a high-voltage transistor.

Figure 2:
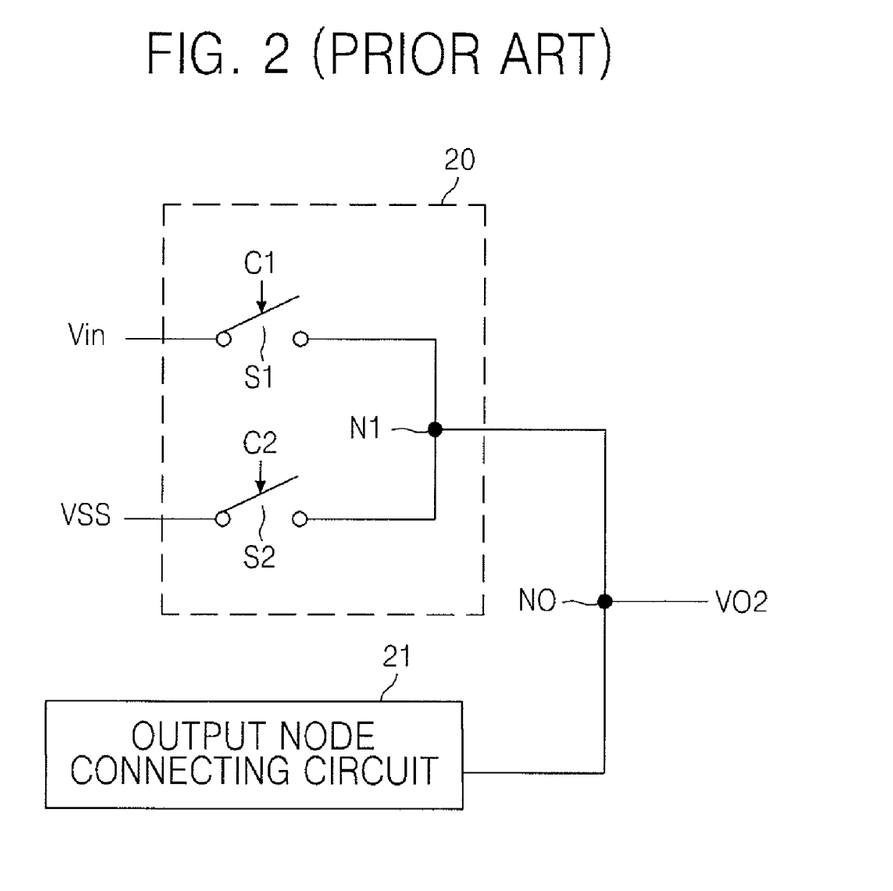
FIG. 2 is a circuit diagram of another switching circuit for comparison with embodiments of the present inventive concept.

FIG. 2 is a circuit diagram of a conventional switching circuit 20 for comparison with embodiments of the present inventive concept. The switching circuit 20 includes first and second input terminals, an output terminal NO, and first and second switches S1 and S2.

The switching circuit 20 receives a first input voltage Vin and a second input voltage VSS through the first and second input terminals, respectively. The first and second switches S1 and S2 selectively output the first and second input voltages Vin and VSS, respectively, as an output voltage VO2 in response to switching control signals C1 and C2, respectively.

The output terminal NO is connected to the switching circuit 20 and to an output node connecting circuit 21 as well. The output node connecting circuit 21 determines the output voltage VO2 in association with the switching circuit 20. The output node connecting circuit 21 may be another switching circuit or a charge pump circuit which includes a capacitor to generate a boosted voltage by pumping electric charges. Accordingly, when the output voltage VO2 has a high voltage level due to the output node connecting circuit 21, the first and second switches S1 and S2 need to be implemented by high-voltage transistors.

As described above, when an output terminal has a high voltage level, a switch connected to the output terminal should be implemented by a high-voltage transistor. If the output terminal NO of the switching circuit 10 illustrated in FIG. 1 has a high voltage level, the switches S1 through S4 connected to the output terminal NO should be all implemented by high-voltage transistors in order to endure high voltage stress.

A high-voltage transistor has a channel at least two times (substantially, about four times) longer than that of a low-voltage transistor. In addition, the gate width (or thickness) of the high-voltage transistor is much greater than that of the low-voltage transistor. Accordingly, the high-voltage transistor is much bigger than the low-voltage transistor. Moreover, when a switch is implemented by the high-voltage transistor, a switching control signal for controlling the high-voltage transistor also has a high voltage level. Accordingly, a switching control signal generator (not shown) generating the high-voltage switching control signal becomes bigger.

Figure 3:
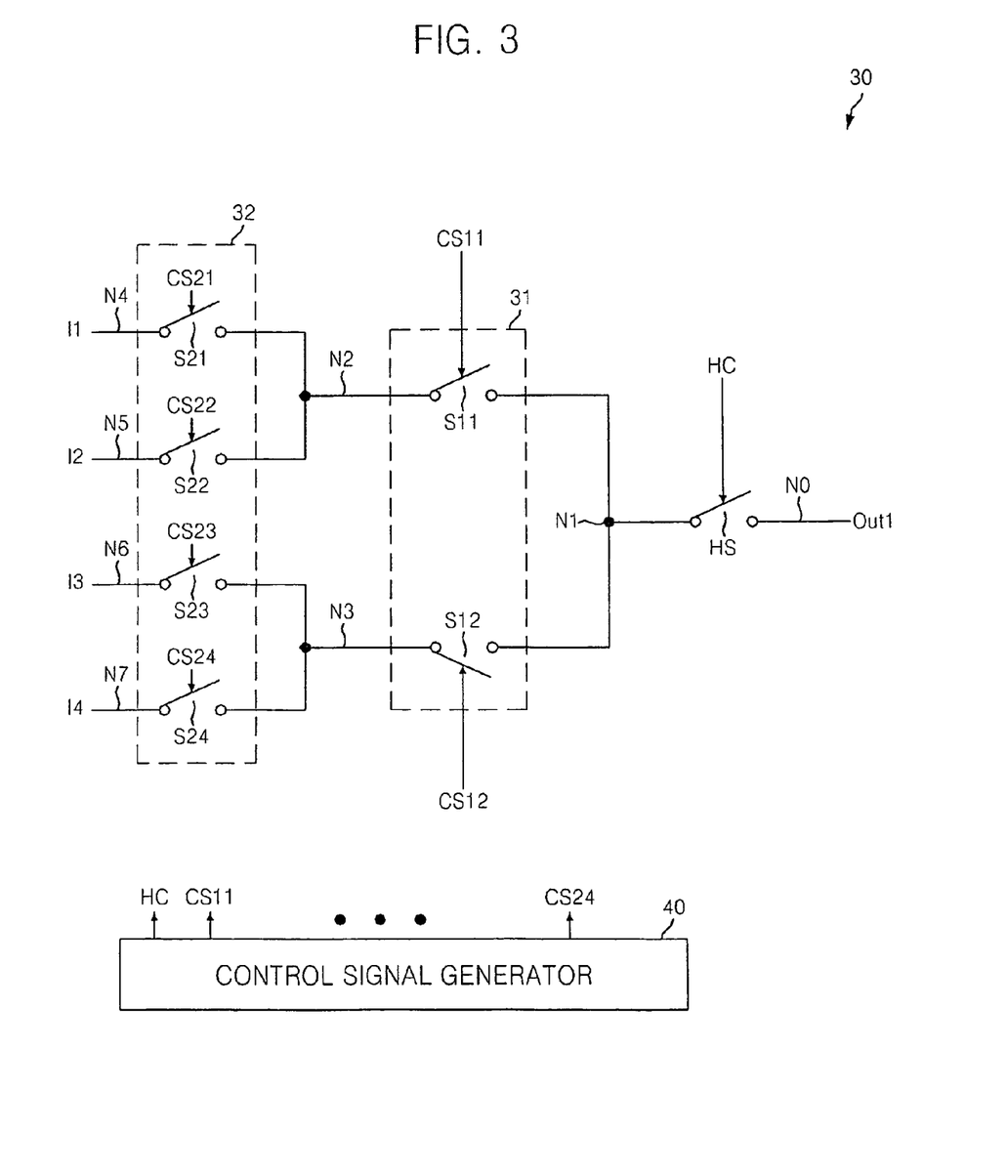
FIG. 3 is a block diagram of a switching circuit according to some embodiments of the present inventive concept.

FIG. 3 is a block diagram of a switching circuit 30 according to some embodiments of the present inventive concept. The switching circuit 30 includes first through fourth input terminals N4, N5, N6, and N7, first group switches S11 and S12, second group switches S21, S22, S23, and S24, and a high voltage switch HS.

Each of the first and second group switches S11, S12 and S21 through S24 is implemented by a low-voltage transistor, and the high voltage switch HS is implemented by a high-voltage transistor. The switching circuit 30 receives first through fourth input signals I1, I2, I3, and I4 through the first through fourth input terminals N4 through N7, respectively. The first through fourth input signals I1 through I4 may be 2Vin, Vin, VSS, and −Vin, respectively. The first and second group switches S11, S12 and S21 through S24 and the high voltage switch HS selectively output one of the first through fourth input signals I1 through I4 as an output voltage Out1 in response to switching control signals CS11, CS12, CS21, CS22, CS23, CS24, and HC, respectively.

A control signal generator 40 generates the switching control signals CS11 through CS24 and HC, thereby controlling the switching circuit 30 to selectively output one of the first through fourth input signals I1 through I4 as the output voltage Out1.

The switching circuit 30 does not directly connect the input terminals N4 through N7 to an output terminal NO but includes cascading medium nodes N1, N2, and N3 interposed between the input terminals N4 through N7 and the output terminal NO. Accordingly, only one switch, i.e., the high voltage switch HS, is directly connected to the output terminal NO having the output voltage Out1 swinging to a high voltage level. So, the high voltage switch HS directly connected to the output terminal NO may be implemented by a high-voltage transistor and the other switches S11 through S24 may be implemented by low-voltage transistors.

Table 1 describes the operation of the switching circuit 30 illustrated in FIG. 3.

TABLE 1

| N2 | N3 | N2 − N3 |
|---|---|---|
| Vin | VSS | Vin |
| Vin | −Vin | 2Vin |
| 2Vin | VSS | 2Vin |

The operation of the switching circuit 30 will be described with reference to FIG. 3 and Table 1. When the second input signal Vin is selected and transmitted to the output terminal NO, the high voltage switch HS and the switches S11 and S22 are turned on and the switch S12 is turned off. As a result, the nodes N1 and N2 are at a Vin level. At this time, the node N3 may be at a VSS level or a −Vin level.

When the first input signal 2Vin is selected and transmitted to the output terminal NO, the high voltage switch HS and the switches S11 and S21 are turned on and the switch S12 is turned off Accordingly, the nodes N1 and N2 are at a 2Vin level. At this time, the node N3 is at the VSS level. That is, it is controlled that the node N3 is at the VSS level when the nodes N1 and N2 are at the 2Vin level, so that a voltage difference (N2−N3) between the nodes N2 and N3 does not exceed 2Vin.

When the fourth input signal I4, i.e., −Vin is selected and transmitted to the output terminal NO, the node N2 is at the Vin level. That is, it is controlled that the node N2 is at the Vin level when the nodes N1 and N3 are at the −Vin level, so that the voltage difference (N2−N3) between the nodes N2 and N3 does not exceed 2Vin. As a result, both ends of the switches S11 through S24 do not have a high voltage, and therefore, the switches S11 through S24 can be implemented by low-voltage transistors.

Figure 4:
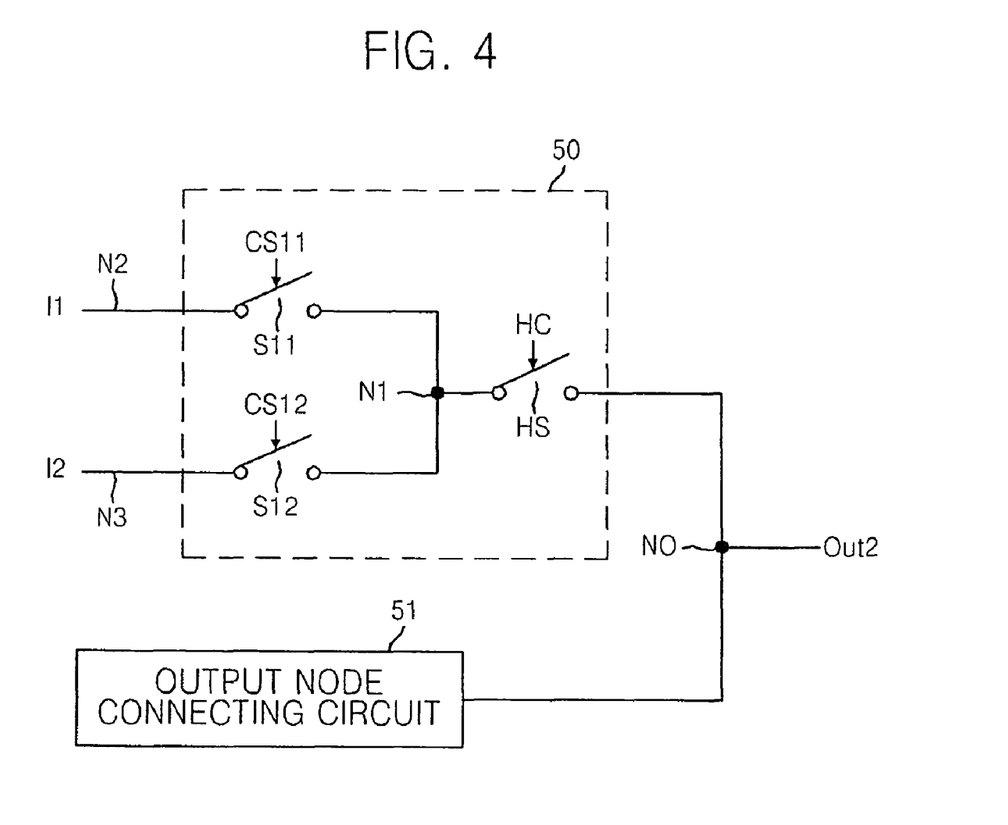
FIG. 4 is a block diagram of a switching circuit according to other embodiments of the present inventive concept.

FIG. 4 is a block diagram of a switching circuit 50 according to according to other embodiments of the present inventive concept. The switching circuit 50 includes first and second input terminals N2 and N3, an output terminal NO, first and second switches S11 and S12, and a high voltage switch HS.

The switching circuit 50 receives first and second input voltages Vin and VSS through the first and second input terminals, respectively. The high voltage switch HS and the first and second switches S11 and S12 selectively output one of the first and second input voltages Vin and VSS as an output voltage Out2 in response to switching control signals HC, CS11, and CS12, respectively.

The output terminal NO is connected to the switching circuit 50 and to an output node connecting circuit 51 as well. The output node connecting circuit 51 determines the output voltage Out2 in association with the switching circuit 50. The output node connecting circuit 51 may be another switching circuit or a charge pump circuit which includes a capacitor to generate a boosted voltage by pumping electric charges.

Although not shown, a control signal generator that generates the switching control signals HC, CS11, and CS12 may also be provided. The control signal generator controls the switching control signals HC, CS11, and CS12, thereby controlling the switching circuit 50 to selectively output one of the first and second input signals I1 and I2 as the output voltage Out2.

The switching circuit 50 does not directly connect the input terminals N2 and N3 to the output terminal NO but includes a cascading medium node N1 interposed between the input terminals N2 and N3 and the output terminal NO. Accordingly, only one switch, i.e., the high voltage switch HS, is directly connected to the output terminal NO having the output voltage Out2 swinging to a high voltage level. So, the high voltage switch HS directly connected to the output terminal NO may be implemented by a high-voltage transistor and the other switches S11 and S12 may be implemented by low-voltage transistors. When the output voltage Out2 is at the high voltage level due to the output node connecting circuit 51, the high voltage switch HS is turned off, so that the stress of the high output voltage Out2 is not applied to the low-voltage switches S11 and S12.

The switching circuit 30 illustrated in FIG. 3 includes more switches than the conventional switching circuit 10 illustrated in FIG. 1, but only one switch in the switching circuit 30 is a high-voltage switch, while all switches S1 through S4 are high-voltage switches in the switching circuit 10. Accordingly, even though the number of switches increases in the switching circuit 30, the area of the switching circuit 30 is smaller than that of the switching circuit 10.

Figure 5:
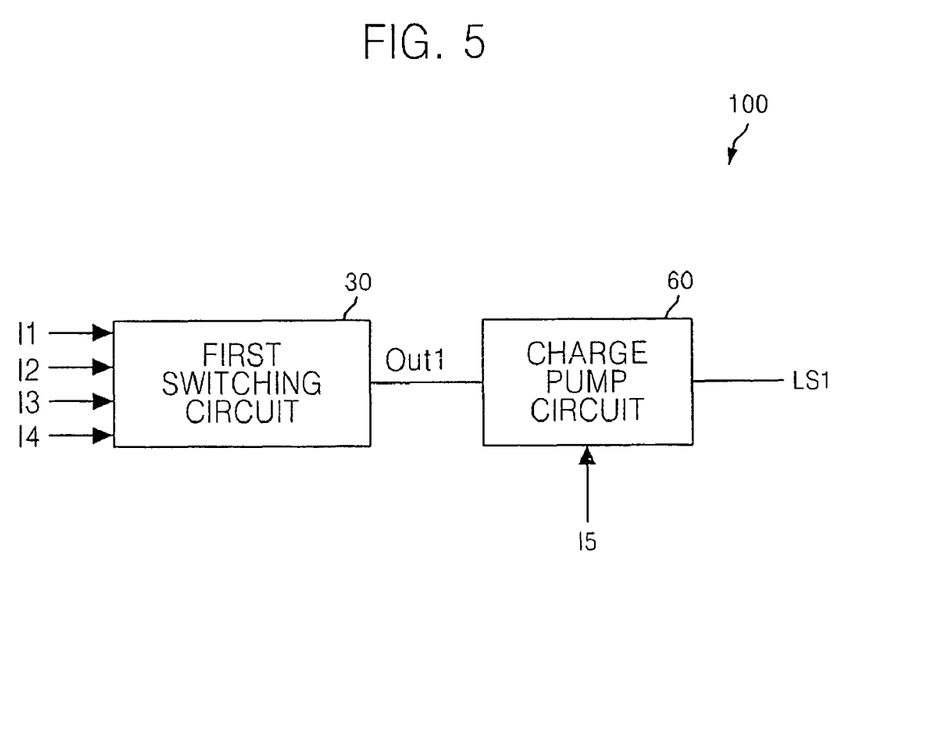
FIG. 5 is a schematic block diagram of a DC-DC converter according to some embodiments of the present inventive concept.

FIG. 5 is a schematic block diagram of a DC-DC converter 100 according to some embodiments of the present inventive concept. The DC-DC converter 100 is a charge pump type DC-DC converter including a first switching circuit 30 and a charge pump circuit 60. The first switching circuit 30 my be the same as the switching circuit 30 illustrated in FIG. 3. Thus, a detailed description thereof will not be repeated. Alternatively, the first switching circuit 30 may be the switching circuit 50 illustrated in FIG. 4 or other modifications.

Figure 7:
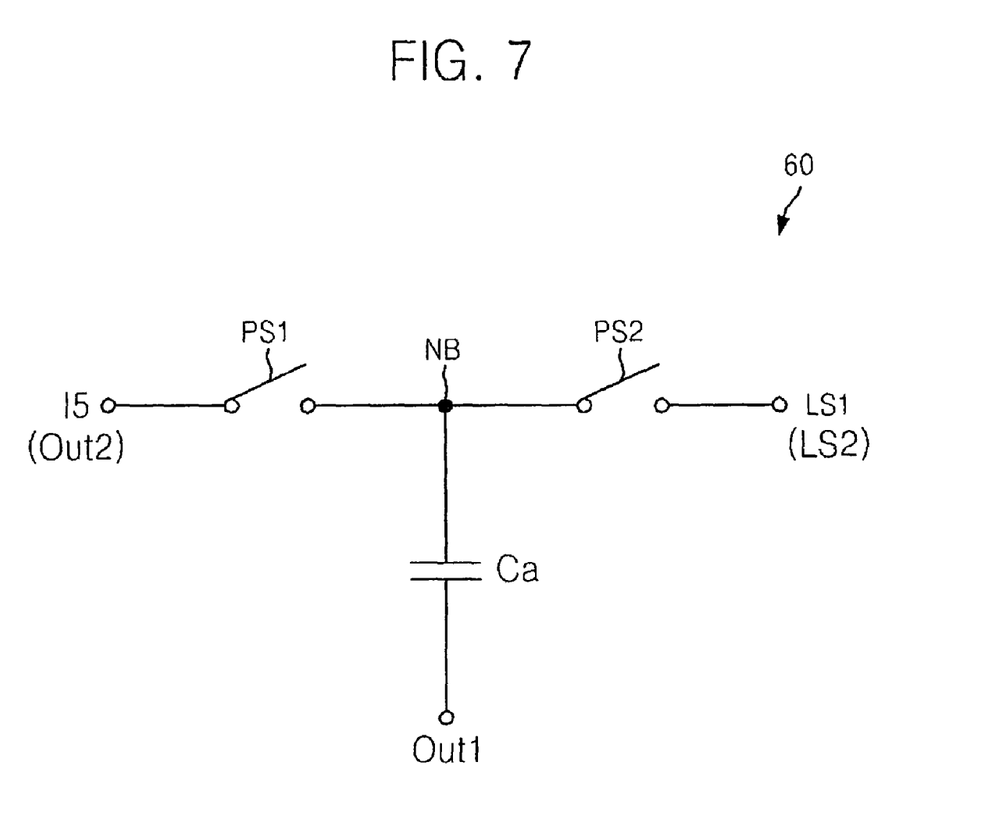
FIG. 7 is a circuit diagram of a charge pump circuit illustrated in FIGS. 5 and 6.

An example of the charge pump circuit 60 is illustrated in FIG. 7. Referring to FIG. 7, the charge pump circuit 60 includes a first switch PS1, a capacitor Ca, and a second switch PS2. An output voltage Out1 of the first switching circuit 30 is input to one terminal of the capacitor Ca, and a fifth input signal I5 is input to an input terminal of the charge pump circuit 60, i.e., one terminal of the first switch PS1. The first and second switches PS1 and PS2 are controlled by first and second switching control signals (not shown), respectively. A circuit (not shown) for generating the first and second switching control signals may also be provided.

In the operation of the charge pump circuit 60, a ground voltage is applied to one terminal of the capacitor Ca and the first switch PS1 is turned on, so that the input signal I5 is transmitted to a boosting node NB. Then, the capacitor Ca is charged with the input signal I5. Thereafter, the first switch PS1 is turned off and the output voltage Out1 of the first switching circuit 30 is applied to the terminal of the capacitor Ca. Then, a voltage at the boosting node NB is boosted from I5 to (I5+Out1). At this time, the second switch PS2 is turned on and the boosted voltage (I5+Out1) is output as a DC-DC converted output voltage LS1.

Referring to FIGS. 5 and 7, the DC-DC converter 100 boosts the input signal I5 of the charge pump circuit 60 by a voltage of an input signal selected from among first through fourth input signals I1 through I4 of the first switching circuit 30. That is, the DC-DC converter 100 boosts the input signal I5 of the charge pump circuit 60 by the selected input signal I1, I2, I3, or I4 and outputs a boosted voltage as the DC-DC converted output voltage LS1.

Alternatively, the input signal I5 may be input to the terminal of the capacitor Ca and the output voltage Out1 of the first switching circuit 30 may be input to the input terminal of the charge pump circuit 60, i.e., the terminal of the first switch PS1.

As another alternative, the DC-DC converter 100 may decrease the input signal I5 by the selected input signal I1, I2, I3, or I4 and output a decreased voltage as a DC-DC converted output voltage.

Figure 6:
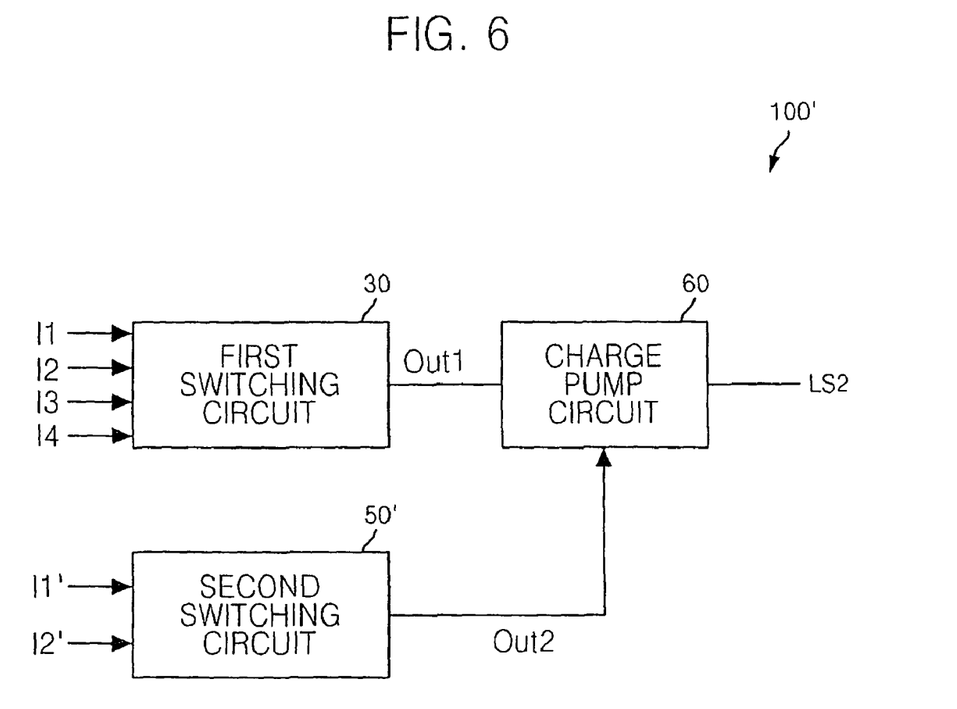
FIG. 6 is a schematic block diagram of a DC-DC converter according to other embodiments of the present inventive concept.

FIG. 6 is a schematic block diagram of a DC-DC converter 100' according to other embodiments of the present invention. The DC-DC converter 100' is a charge pump type DC-DC converter including the first switching circuit 30, a second switching circuit 50', and the charge pump circuit 60.

The first switching circuit 30 may be the same as the switching circuit 30 illustrated in FIG. 3 and the second switching circuit 50' may be the same as the switching circuit 50 illustrated in FIG. 4. Thus, detailed descriptions thereof will not be trepeated. The structure and the operation of the charge pump circuit 60 have been described, thus a detailed description thereof will also not be repeated.

Referring to FIGS. 6 and 7, the DC-DC converter 100' boosts an output voltage Out2 of the second switching circuit 50' by the output voltage Out1 of the first switching circuit 30. The output voltage Out1 of the first switching circuit 30 is one selected from among the input signals I1 through I4 and the output voltage Out2 of the second switching circuit 50' is one selected from between input signals I1' and I2'.

Alternatively, the output signal Out2 of the second switching circuit 50' may be input to the terminal of the capacitor Ca and the output voltage Out1 of the first switching circuit 30 may be input to the input terminal of the charge pump circuit 60, i.e., the terminal of the first switch PS1.

As another alternative, the DC-DC converter 100' may decrease the output signal Out2 of the second switching circuit 50' by the output voltage Out1 of the first switching circuit 30 and output a decreased voltage as a DC-DC converted output voltage.

Figure 8:
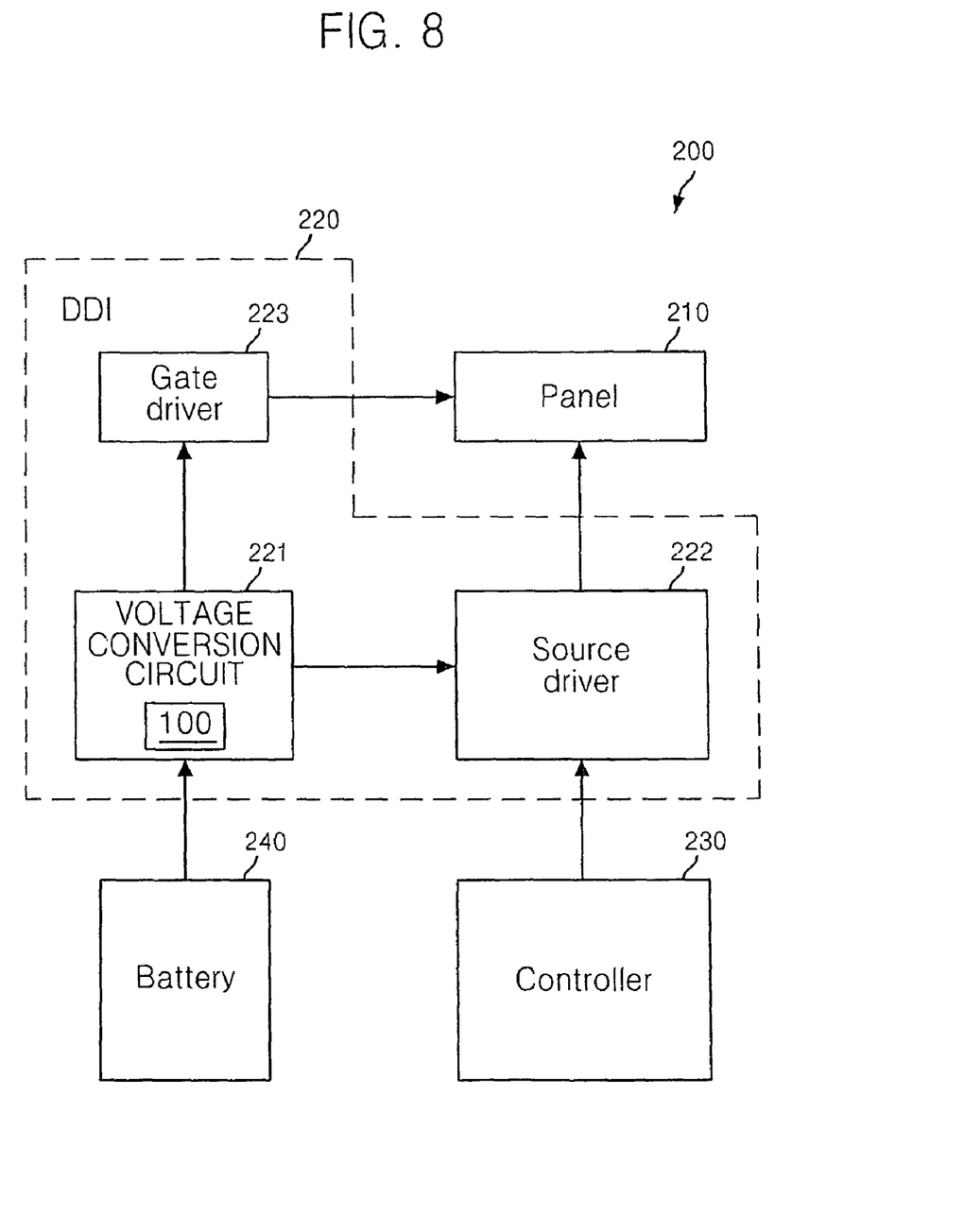
FIG. 8 is a block diagram of a display device including a DC-DC converter according to some embodiments of the present inventive concept.

FIG. 8 is a block diagram of a display device 200 including the DC-DC converter 100 according to some embodiments of the present invention. The display device 200 includes a display panel 210, a display driver circuit 220, a controller 230, and a battery 240. The display device 200 may be a portable terminal.

The display driver circuit 220 includes a voltage conversion circuit 221, a source driver 222, and a gate driver 223. The display panel 210 includes a plurality of data lines, a plurality of gate lines, and a plurality of pixels including a unit cell. The display panel 210 may be an organic light-emitting diode (OLED) panel or a liquid crystal display (LCD) panel and the display driver circuit 220 may be an OLED driver integrated circuit (IC) or an LED driver IC, but the present invention is not restricted thereto.

The voltage conversion circuit 221 includes the DC-DC converter 100 illustrated in FIG. 5. The voltage conversion circuit 221 DC-DC converts a voltage received from the battery 240 and outputs a DC-DC converted voltage to the source driver 222 and the gate driver 223. The gate driver 223 drives the gate lines using the DC-DC converted voltage output from the voltage conversion circuit 221. The source driver 222 drives the data lines using the DC-DC converted voltage output from the voltage conversion circuit 221.

The display device 200 illustrated in FIG. 8 is just an example in which the DC-DC converter 100 according to some embodiments of the present invention can be used, and the application of the DC-DC converter 100 is not restricted to the display device 200.

According to some embodiments of the present invention, most of switches included in a switching circuit can be implemented by low-voltage transistors instead of high-voltage transistors. As a result, the overall area of the switching circuit and the overall area of a DC-DC converter including the switching circuit can be reduced.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A switching circuit for supplying a voltage to a display driver, comprising:
   an output terminal for connection to the display driver;
   a first switch connected between the output terminal and a first node to operate in response to a first switching control signal;
   a second switch connected between the first node and a second node to operate in response to a second switching control signal; and
   a third switch connected between the first node and a third node to operate in response to a third switching control signal,
   wherein the first switch is implemented using a high-voltage transistor,
   the voltage difference between the first and second nodes and the voltage difference between the first and third nodes are limited by control signals to a value sustainable by a low-voltage transistor,
   each of the second and third switches is implemented using a low-voltage transistor, and
   a gate of the high-voltage transistor is at least two times longer than a gate of the low-voltage transistor.

2. The switching circuit of claim 1, wherein the second node and the third node receive a first input signal and a second input signal, respectively, and the switching circuit selectively transmits the first and second input signals to the output terminal in response to the first through third switching control signals.

3. The switching circuit of claim 1, further comprising:
   a fourth switch connected between the second node and a fourth node to operate in response to a fourth switching control signal;
   a fifth switch connected between the second node and a fifth node to operate in response to a fifth switching control signal;
   a sixth switch connected between the third node and a sixth node to operate in response to a sixth switching control signal; and
   a seventh switch connected between the third node and a seventh node to operate in response to a seventh switching control signal,
   wherein each of the fourth through seventh switches is implemented using a low-voltage transistor.

4. The switching circuit of claim 3, wherein the fourth through seventh nodes receive first through fourth input signals, respectively, and the switching circuit selectively transmits the first through fourth input signals to the output terminal in response to the first through seventh switching control signals.

5. A display driver integrated circuit comprising:
   a DC-DC converter;
   the display driver configured to drive a plurality of data lines and a plurality of gate lines in a display panel based on at least one DC-DC converted voltage,
   wherein the DC-DC converter outputs the at least one DC-DC converted voltage based on a plurality of input signals input through a plurality of input terminals, and
   the DC-DC converter comprising a switching circuit:
   wherein the switching circuit comprises:
   the plurality of input terminals;
   an output terminal to output the at least one DC-DC converted voltage;
   a plurality of switches configured to selectively connect the plurality of input terminals to the output terminal, the plurality of switches comprising a first switch directly connected to the output terminal and a plurality of second switches connecting the plurality of input terminals to the first switch,
   wherein the first switch is implemented using a high-voltage transistor and the voltage difference across the second switches is limited by control signals to a value sustainable by a low-voltage transistor,
   each of the second switches is implemented using a low-voltage transistor, and a gate of the high-voltage transistor is at least two times longer than a gate of the low-voltage transistor.

6. The display driver integrated circuit of claim 5, wherein the first switch comprises a first high-voltage transistor connected between the output terminal and a first node to operate in response to a first switching control signal, and
   the second switches comprise:
   a first low-voltage transistor connected between the first node and a second node to operate in response to a second switching control signal; and
   a second low-voltage transistor connected between the first node and a third node to operate in response to a third switching control signal.

7. The display driver integrated circuit of claim 6, wherein the second switches further comprise:
   a third low-voltage transistor connected between the second node and a fourth node to operate in response to a fourth switching control signal;
   a fourth low-voltage transistor connected between the second node and a fifth node to operate in response to a fifth switching control signal;
   a fifth low-voltage transistor connected between the third node and a sixth node to operate in response to a sixth switching control signal; and
   a sixth low-voltage transistor connected between the third node and a seventh node to operate in response to a seventh switching control signal, and
   the fourth through seventh nodes receive first through fourth input signals, respectively.

8. The display driver integrated circuit of claim 7, wherein voltage levels of the first through fourth input signals decrease in order of the first to the fourth input signals;
   when the first input signal is selected and transmitted to the output terminal, the second low-voltage transistor is controlled not to be connected with the fourth input signal; and
   when the fourth input signal is selected and transmitted to the output terminal, the first low-voltage transistor is controlled not to be connected with the first input signal.

9. The display driver integrated circuit of claim 5, wherein the display driver integrated circuit is a liquid crystal display (LCD) driver integrated circuit (IC) or an organic light-emitting diode (OLED) driver IC.

* * * * *